United States Patent [19]
Yamashita

[11] Patent Number: 5,929,670
[45] Date of Patent: Jul. 27, 1999

[54] METHOD FOR IMPROVING SIGNAL GENERATOR FREQUENCY PRECISION USING COUNTERS

[75] Inventor: Hideki Yamashita, Hyogo, Japan

[73] Assignee: Hewlett-Packard Company, Palo Alto, Calif.

[21] Appl. No.: 08/782,846

[22] Filed: Jan. 13, 1997

[30]  Foreign Application Priority Data

Jan. 26, 1996 [JP] Japan ................................. 8-011792

[51] Int. Cl.$^6$ .................................................. H03B 19/00
[52] U.S. Cl. ......................... 327/116; 327/113; 327/42; 327/48
[58] Field of Search ............................. 327/116, 42, 48, 327/113, 160, 107; 377/39

[56]  References Cited

U.S. PATENT DOCUMENTS

| | | | |
|---|---|---|---|
| 3,832,640 | 8/1974 | Cederquist | 327/116 |
| 3,970,954 | 7/1976 | Even | 327/116 |
| 4,025,868 | 5/1977 | Miki | 327/48 |
| 4,594,563 | 6/1986 | Williams | 327/48 |
| 5,459,435 | 10/1995 | Taki | 327/160 |
| 5,694,066 | 12/1997 | Shyong | 327/113 |

OTHER PUBLICATIONS

Hewlett–Packard Service Manual, Model 4194A, Impedance/grain–Phase Analyzer, printed Jun., 1986, 3 pages.

*Primary Examiner*—Timothy P. Callahan
*Assistant Examiner*—April Giles

[57]  ABSTRACT

A method for improving the precision of a signal generator utilizing counters. The difference between an external standard signal frequency and an internal standard frequency is measured by digital counters. The signal of this internal standard frequency signal source is counted by a first counter and the frequency of an external standard frequency signal source is counted by a second counter. A calculating and control part determines the accurate frequency of internal standard frequency signal source from count values of both counters. The measurement frequency signal source generates a signal with the desired frequency. The circuit is digitally implemented.

8 Claims, 1 Drawing Sheet

METHOD FOR IMPROVING SIGNAL GENERATOR FREQUENCY PRECISION USING COUNTERS

FIELD OF THE INVENTION

This invention relates to variable-frequency signal sources in general and, in particular, it concerns an improvement in the frequency precision of a measurement signal in a network analyzer.

BACKGROUND OF THE ART

A network analyzer produces a measurement signal with a desired frequency on the basis of the frequency of an internal standard signal source. The frequency precision of such a measurement signal is no greater than the frequency precision of the internal standard signal. To satisfy the desire to utilize measurement signal frequencies that are more precise than the frequency of an internal standard signal source, a method is used in which an external standard signal with a more precise frequency than the internal standard signal is fed to the network analyzer and a highly precise measurement signal is obtained on the basis of this external standard signal.

In the implementation of the above described method, a voltage-controlled oscillator is used as the internal standard signal source, and the signal of the voltage-controlled oscillator is synchronized with the external standard signal by use of phase-locking technology. An example of this method is shown in FIG. 2.

In FIG. 2, 10 is a network analyzer and the structural elements of a network analyzer that are not related to this invention are omitted. An internal standard frequency signal source 19 is a voltage-controlled oscillator. In ordinary measurements, in which the frequency precision of internal standard frequency signal source 19 is sufficient for the accuracy of the measurement frequency, the input of internal standard frequency signal source 19 is held constant and a constant frequency, within the desired frequency precision, is output. Moreover, it is not necessary to connect an external standard frequency signal source 16.

A measurement frequency signal source 12 generates a measurement frequency signal of the desired frequency which is a rational-number multiple of the frequency of internal standard frequency signal source 19 by using a frequency synthesizing technology and feeds it to the other circuits in the network analyzer. A calculating and control part 13 calculates the factor for obtaining the desired measurement frequency and controls measurement frequency signal source 12.

The output of standard frequency signal source 19 is also connected to one input terminal of a phase comparator 17. The output of phase comparator 17 is connected to the input of internal standard frequency signal source 19 through an integrator 18 and thus a phase-locked loop circuit results. When the measurement is performed with the frequency precision of internal standard frequency signal source 19, as described above, the phase-locked loop is cut and the input of internal standard frequency signal source 19 is held at a constant value. FIG. 2 omits the circuit for switching the phase-locked loop on and off.

When one wants to make a measurement with a measurement frequency that is more precise than the frequency precision of internal standard frequency signal source 19, an external standard frequency signal source 16 is connected and the phase-locked loop is closed, forming the structure shown in FIG. 2.

Since the signal of external standard frequency signal source 16 is input into the other input of phase comparator 17, phase comparator 17 outputs a signal with a direct current component proportional to the phase difference of the signals of internal standard frequency signal source 19 and external standard frequency signal source 16. The direct current component of this output is returned to internal standard frequency signal source 19 through integrator 18 and controls the frequency of internal standard frequency signal source 19. Due to the negative feedback of this phase-locked loop, the frequency of internal standard frequency signal source 19 corresponds to the frequency of external standard frequency signal source 16.

In this manner, internal standard frequency signal source 19 generates a frequency with the precision of the frequency of external standard frequency signal source 16.

The phase-locked loop technology requires complex circuits containing analog circuits; it has many technological difficulties and increases cost. Furthermore, if phase noise is superimposed on the signal of the external standard frequency, this phase noise is also superimposed on measurement frequency signal source 12 through internal standard frequency signal source 19, and the phase noise of the measurement signal worsens. Under conditions in which the electromagnetic wave environment is a serious problem, such as in factories, phase noise is frequently superimposed on the external standard frequency signal, and measures such as shielding or filtering are ordinarily required to eliminate it.

As can thus be understood, if the frequency precision of an internal measurement frequency signal source in a prior art network analyzer was insufficient, the precision of the measurement frequency was improved by using a phase-locking circuit, on the basis of an external standard frequency signal source. This method was costly and used complex circuits. Further, when phase noise was superimposed on the external standard frequency signal source, complex measures were needed to remove it.

Accordingly, it is an object of this invention to provide a method for improving the frequency precision of a measurement signal with a simple circuit, and to reduce the cost thereof.

SUMMARY OF THE INVENTION

In place of a prior art analog phase-locked loop circuit, the difference between an external standard signal frequency and an internal standard signal frequency is measured by digital counters and the precise frequency of the internal standard signal is thus determined. On this basis, a rational-number multiplier by which the frequency of the internal measurement frequency signal source is multiplied by the measurement frequency signal source to obtain the desired measurement signal is corrected, and the frequency precision of the measurement signal is improved.

EXPLANATION of SYMBOLS

Figure 1:
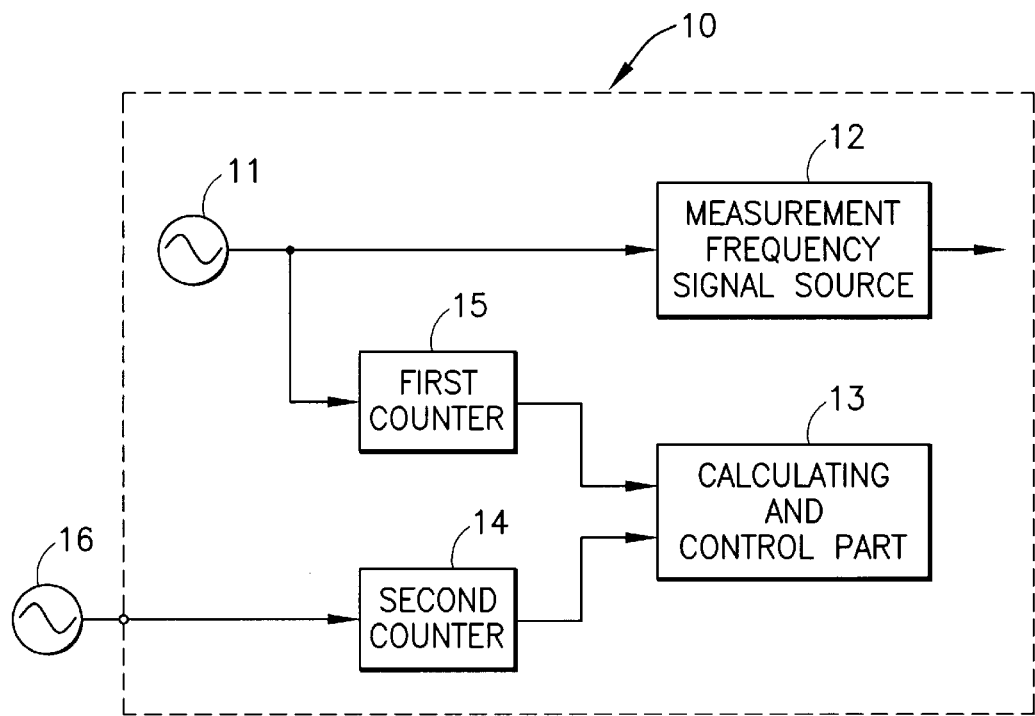
FIG. 1: Drawing showing an embodiment of this invention.

10: Network analyzer
11: Internal standard frequency signal source
12: Measurement frequency signal source
13: Calculating and control part 14: Second counter
15: First counter
16: External standard frequency signal source
17: Phase comparator
18: Integrator
19: Internal standard frequency signal source

DETAILED DESCRIPTION OF THE INVENTION

Figure 2:
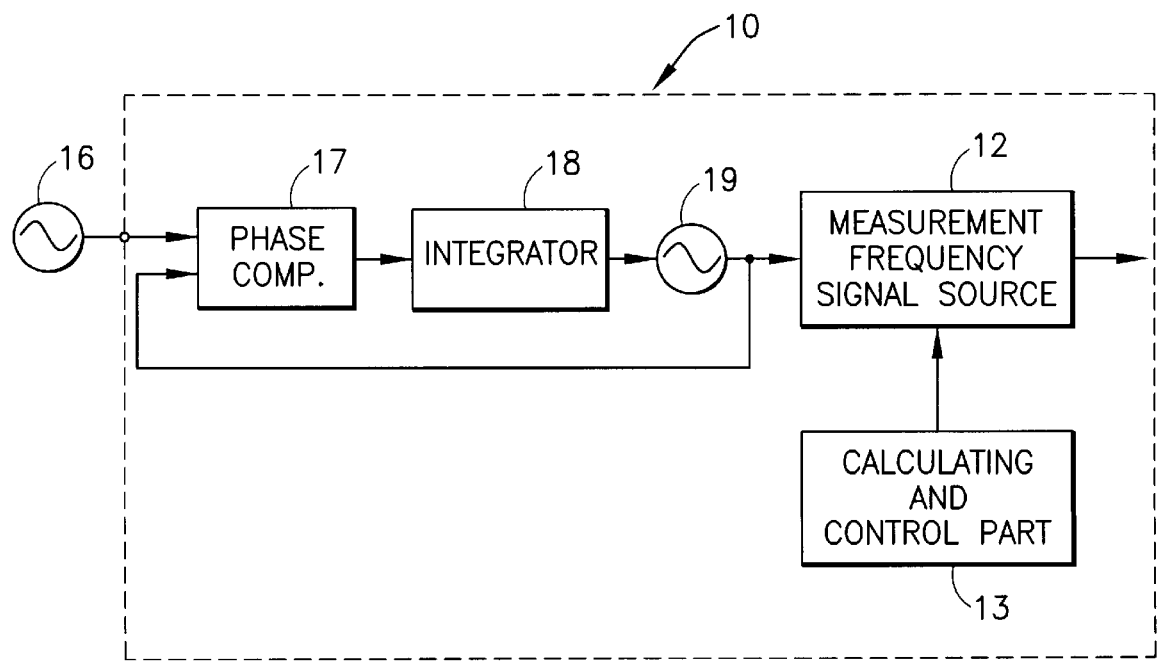
FIG. 2: Drawing showing an example of the prior art.

FIG. 1 shows an embodiment of this invention and the elements that are the same as those in FIG. 2 are given the same reference numbers. As in the prior art, the frequency of internal standard frequency signal source 11 is multiplied by a rational-number factor to produce measurement frequency signal source 12, causing a measurement signal with the desired frequency to be output and fed to other circuits of the network analyzer.

Calculating and control part 13 receives a multiplier for obtaining the desired measurement frequency by a calculation described below, and controls measurement frequency signal source 12.

Calculating and control part 13 calculates the value of (N2/N1)*(Fm/Fr), and utilizes the value to control measurement frequency signal source 12 to generate the desired output frequency (i.e., measurement frequency Fm). An exemplary measurement frerquency signal source 12 is a phase locked loop and the frequency division ratio of a frequency dividerin its feedback loop is set to the value of (N2/N1)*(Fm/Fr) by calculating and control part 13.

The output of internal standard frequency signal source 11 is also connected to a first counter 15. The output of external standard frequency signal source 16 is connected to the input of a second counter 14. The first and second counters count the numbers of signal cycles from internal standard frequency signal source 11 and external standard frequency signal source 16 and input these count values into calculating and control part 13.

The first and second counters 15, 14 can start and stop counting at any desired times. The first and second counters 15, 14 start counting simultaneously. At a point in time at which first counter 15 (or second counter 14) has counted up to a certain number, first and second counters 15, 14 stop counting simultaneously. If the count values of first and second counters 15, 14 at this time are N1 and N2, respectively, and the external standard frequency, a known quantity, is Fr (Hz), then the internal standard frequency Fi is expressed by Fi=(N1/N2)×Fr.

If one wishes to generate a signal of Fm (Hz) in measurement frequency signal source 12, measurement frequency source 12 can be controlled by calculating and control part 13 in such a way that a signal is produced from measurement frequency signal source 12 with a frequency Fm/Fi=(N2/N1)×(Fm/Fr) times the internal standard frequency Fi. In this manner, a measurement signal can be produced with the frequency precision of external standard frequency signal source 16.

If control of measurement frequency signal source 12 by calculation and control part 13, as described above, is repeated over a long time, starting from the beginning of the counting of first and second counters 15 and 14, a measurement signal with the frequency precision of external standard frequency signal source 16 can be output over a long period.

As stated above, the counting is stopped when the first or second counter has counted a specific number, but the same results can also be obtained by a method in which the counting of the first and second counters is started simultaneously and stopped simultaneously after a specific time. Moreover, an example was described above in which this invention was applied to a network analyzer, but it is clear that it can also be applied to impedance measurement devices or other devices.

Because the principal parts of the circuit described above can be completely digital instead of a complex analog phase-locking circuit, the number of parts are reduced and highly precise frequencies can be generated. In general, it is difficult to convert circuits containing analog components into integrated circuits, but digital circuits can be easily made into integrated circuits, and the number of parts can be still further reduced. As a result, the costs are reduced.

Furthermore, by taking a sufficiently long counting time, the effects of phase noise superimposed on the external standard frequency signal can easily be removed. As a result, the affects of phase noise are excluded.

One embodiment was described above, but the form, arrangement, and other aspects of this example are not limited; the structure may be changed as desired, as long as the concept of the invention is preserved.

I claim:

1. A signal generator comprising:

a first standard signal generator for generating a first frequency signal;

a second standard signal generator for generating a second frequency signal;

first counter means for counting a number of cycles of said first frequency signal as a first count;

second counter means for counting a number of cycles of said second frequency signal as a second count;

calculating and control means responsive to said first count and said second count for calculating a numerical value, which is a rational-number multiple of the frequency of the first standard signal, from count values of the first counter and second counter; and frequency synthesizing means responsive to said numerical value for producing an output signal having a frequency, which is the frequency of the first standard signal multiplied by a factor derived from the numerical value.

2. A signal generator comprising:

a first standard signal generator for generating a first standard signal, calculating and control means, frequency synthesizing means for generating an output signal with a desired frequency derived by multiplying, by a rational number, a frequency of the first standard signal, and second standard signal generator means for generating a second standard signal and having a first counter and a second counter, said first counter counting a number of cycles of the first standard signal, the second counter counting a number of cycles of the second standard signal;

said calculating and control means calculating said rational number by deriving a numerical relationship between output frequencies of the first standard signal and the second standard signal from count values issued by the first counter and second counter, and further providing said rational number to said frequency synthesizing means to enable generation of said output signal.

3. A signal generator in accordance with claim 1, wherein the first counter begins to count a number of cycles of the first standard signal, and at a same time the second counter begins to count a number of cycles of the second standard signal, and when a count value of the first counter or the second counter reaches a prescribed value, both counters are stopped simultaneously.

4. A signal generator in accordance with claim 1, wherein the first counter begins to count a number of cycles of the first standard signal,. and at the same time, the second counter begins to count a number of cycles of the second standard signal, and counting of the first counter and second counter are stopped simultaneously after a specific time.

5. A signal generator in accordance with claim 1, wherein the second standard signal generator is an external frequency standard signal.

6. A signal generator in accordance with claim 2, wherein the first counter begins to count a number of cycles of the first standard signal, and at the same times the second counter begins to count a number of cycles of the second standard signal, and when a count value of the first counter or the second counter reaches a prescribed value, both counters are stopped simultaneously.

7. A signal generator in accordance with claim 2, wherein the first counter begins to count a number of cycles of the first standard signal, and at the same time, the second counter begins to count the number of cycles of of the second standard signal, and counting of the first counter and second counter are stopped simultaneously after a specific time.

8. A signal generator in accordance with claim 2, wherein the second standard signal generator is an external frequency standard signal.

\* \* \* \* \*